US005659587A

United States Patent [19]
Knierim

[11] Patent Number: 5,659,587
[45] Date of Patent: Aug. 19, 1997

[54] SPREAD SPECTRUM PHASE-LOCKED LOOP CLOCK GENERATOR WITH VCO DRIVEN BY A SYMMETRICAL VOLTAGE RAMP SIGNAL

[75] Inventor: David L. Knierim, Wilsonville, Oreg.

[73] Assignee: Tektronix, Inc., Wilsonville, Oreg.

[21] Appl. No.: 344,267

[22] Filed: Nov. 23, 1994

[51] Int. Cl.$^6$ .............................. H03D 3/24; H04B 15/00
[52] U.S. Cl. ........................... 375/376; 375/200; 375/204; 380/34
[58] Field of Search .................... 375/376, 204, 375/373, 371, 340, 322–327; 380/48, 34; 329/345, 346, 360; 331/10, 17

[56] References Cited

U.S. PATENT DOCUMENTS

| | | | |
|---|---|---|---|
| 4,359,779 | 11/1982 | Levine | 455/110 |
| 4,914,674 | 4/1990 | Kimber et al. | 375/200 |
| 4,961,203 | 10/1990 | Maufe et al. | 375/200 |
| 5,095,288 | 3/1992 | Dent | 331/17 |
| 5,144,260 | 9/1992 | Stribling et al. | 331/10 |
| 5,263,055 | 11/1993 | Cahill | 375/346 |
| 5,488,627 | 1/1996 | Hardin et al. | 375/204 |

OTHER PUBLICATIONS

Gardner, Phaselock Techniques, 1970 p. 219.
Dixon, Spread Spectrum Systems, 1984, pp. 44–45.
IMISG501 System Clock Chip Data Sheet, May 2, 1994, pp. 1–7.
*Interferrence Technology Engineers Master*, R&B Enterprises, West Conshaochocken, Pennsylvania, 1994 (month unknown), pp. 88–89, 278, 280, (3 pgs of graphs).

Primary Examiner—Wellington Chin
Assistant Examiner—William Luther
Attorney, Agent, or Firm—Ralph D'Alessandro; John Smith-Hill

[57] ABSTRACT

A phase-locked loop circuit comprises a VCO and a ramp generator. The ramp generator has an output connected to a control terminal of the VCO. A center frequency control loop is connected between a signal output terminal of the VCO and a first ramp control input of the ramp generator and a spread spectrum control loop is connected between the signal output terminal of the VCO and a second ramp control input of the ramp generator. The signals applied to the ramp control inputs of the ramp generator by the two control loops control respective characteristics of a periodic voltage ramp signal that is generated by the ramp generator at its signal output terminal.

28 Claims, 2 Drawing Sheets

SPREAD SPECTRUM PHASE-LOCKED LOOP CLOCK GENERATOR WITH VCO DRIVEN BY A SYMMETRICAL VOLTAGE RAMP SIGNAL

BACKGROUND OF THE INVENTION

This invention relates to a spread spectrum phase-locked loop clock generator.

Timing control of many electronic devices, such as microprocessors, is provided by a clock signal. Typically, the clock signal has a frequency of several megahertz. The waveform of the clock signal is approximately trapezoidal in form, and the clock signal normally has energy at its fundamental frequency and at each integer multiple of the fundamental frequency.

The clock signal may be generated by a crystal oscillator. The crystal oscillator has the advantage that its oscillation frequency is stable, so that it is relatively easy to guard against the possibility that drift will result in the fundamental frequency of the clock signal exceeding the clock frequency rating of the microprocessor and leading to a malfunction of the microprocessor.

The crystal oscillator has a very high Q value, which results in the energy of the clock signal being concentrated in a narrow fundamental frequency band and harmonics of that band. The concentration of energy at the high frequencies of the harmonics of the clock frequency can lead to emission of electromagnetic interference (EMI) in excess of that permitted under applicable government regulations.

It is known to reduce the level of electromagnetic interference resulting from a microprocessor clock signal by varying the frequency of the clock signal, so that the energy is not concentrated in a narrow fundamental frequency band and the harmonics of that band. For example, the IMISG501 system clock chip sold by International Microcircuits, Inc. of Milpitas, Calif. employs intentional broadbanding to reduce electromagnetic interference.

On first consideration, it might appear attractive to vary the frequency of the clock signal in accordance with a symmetrical triangular waveform composed of two ramps of equal but opposite slope. However, on closer examination, it becomes apparent that this does not provide the optimum solution because at the positive and negative turning points of the waveform there is a region over which the clock frequency varies only slightly. This results in excessive EMI at the two extremes of the range through which the frequency is varied.

SUMMARY OF THE INVENTION

According to a first aspect of the present invention there is provided a phase-locked loop circuit comprising a VCO having a control terminal and a signal output terminal, a ramp generator having an output connected to the control terminal of the VCO and also having first and second ramp control inputs for receiving first and second control signals upon which first and second characteristics of a periodic voltage ramp signal generated by the ramp generator at its signal output terminal respectively depend, and a reset input for receiving a periodic reset signal, a center frequency control loop connected between the signal output terminal of the VCO and the first ramp control input of the ramp generator, and a spread spectrum control loop connected between the signal output terminal of the VCO and the second ramp control input of the ramp generator.

According to a second aspect of the present invention there is provided a spread spectrum clock generator, comprising a VCO having a control terminal and an output terminal, and a ramp generator for generating a periodic voltage ramp signal and applying the periodic voltage ramp signal to the control terminal of the VCO, the periodic voltage ramp signal having a rising segment and a falling segment and the magnitude of the slope of one of the segments being much greater than the magnitude of the slope of the other segment.

According to a third aspect of the present invention there is provided electronic apparatus comprising a timed device that is responsive to input signals to change state on occurrence of a clocking transition at a clock input of the timed device, and a clock generator that generates a clock signal having a succession of clocking transitions at a clock output connected to the clock input of the timed device, and wherein the frequency of the clock signal varies periodically in accordance with a ramp function, each period of the ramp function being composed of a first segment, during which the frequency of the clock signal changes at a first rate, and a second segment, during which the frequency of the clock signal changes at a second rate, the first and second rates being of opposite polarity and the magnitude of the first rate being much greater than the magnitude of the second rate.

According to a fourth aspect of the present invention there is provided a method of operating electronic apparatus that comprises a timed device responsive to input signals to change state on occurrence of a clocking transition at a clock input of the timed device, said method comprising applying a periodic clock signal having a succession of clocking transitions to the clock input of the timed device, and varying the period of the clock signal periodically in accordance with a ramp function, each period of the ramp function being composed of a first segment, during which the period of the clock signal changes at a first rate, and a second segment, during which the period of the clock signal changes at a second rate, the first and second rates being of opposite polarity and the magnitude of the first rate being much greater than the magnitude of the second rate.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
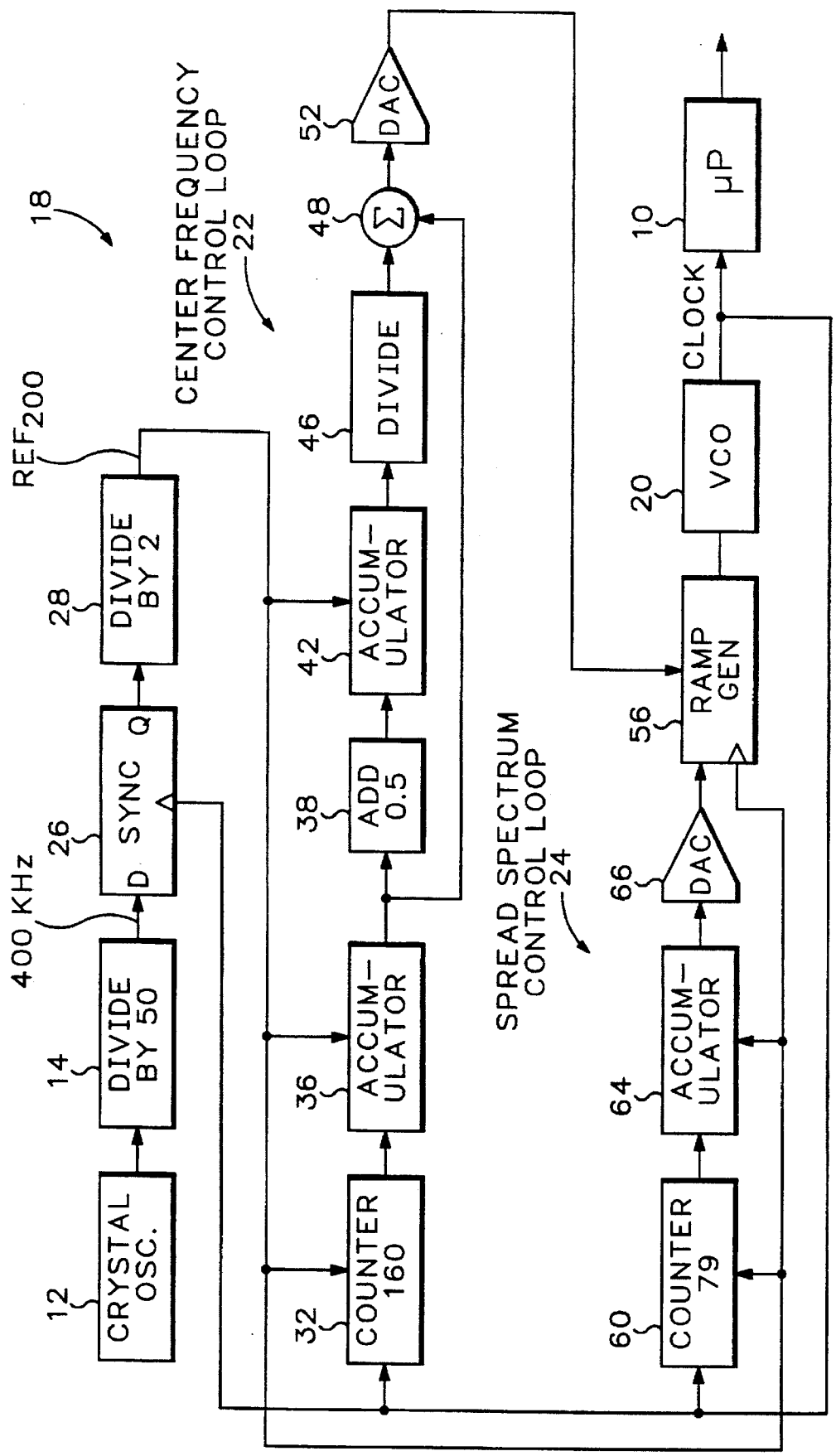
FIG. 1 is a block diagram of a spread spectrum clock generator in accordance with the present invention.

The clock generator illustrated in FIG. 1 is used to generate a clock signal that controls the timing of the operation of a microprocessor 10 having a rated clock frequency of 33.3 MHz. The clock generator comprises a crystal oscillator 12 that generates an output signal at a frequency of 20 MHz and a divider 14 that divides the frequency of the oscillator output signal to 400 kHz. The 400 kHz signal is applied as an external reference to a phase-locked loop circuit 18, which includes a voltage-controlled oscillator (VCO) 20 and two control loops 22 and 24. The VCO provides a VCO clock signal at a nominal frequency of 32 MHz to the microprocessor 10. It will be seen in due course that through operation of the control loops 22 and 24, the frequency of the VCO clock signal varies between 31.2 MHz and 32.8 MHz.

The phase-locked loop circuit 18 comprises a synchronizer 26, whereby the output signal of the divider 14 is synchronized with the VCO clock signal. The synchronizer may comprise a D flip-flop that receives the 400 kHz external reference signal at its D input and the VCO clock signal at its clock input. The Q output of the flip-flop is at the same frequency as the external reference signal but its edges are synchronized to the positive going edges of the VCO clock signal, subject to the delay in the D flip-flop. It is preferred that the synchronizer should contain a second D flip-flop, with its D input connected to the Q output of the first flip-flop and its clock input receiving the VCO clock signal, so as to avoid metastable states in the synchronized reference signal.

The synchronized reference signal is divided by two by a divider 28, providing a 200 kHz signal $REF_{200}$ in which the falling edges occur halfway between the rising edges, within +/−1 VCO clock. This low frequency reference signal, having a period of 5 µs, is used to control operation of the two control loops 22 and 24.

The center frequency control loop 22 comprises a counter 32 that counts positive going edges of the VCO clock signal. The first rising edge of the VCO clock signal following the positive going edge of the low frequency reference signal $REF_{200}$ captures the count stored in the counter 32 into a phase error accumulator 36 and also loads the value −159 into the counter 32. Each subsequent rising edge of the VCO clock signal increments the count stored in the counter by 1. Thus, if 160 VCO clock edges occur between $REF_{200}$ positive going edges, the counter 32 contains the count 0 at the end of its counting period. In general, the count stored in the counter 32 at the end of its counting period is equal to the difference between 160 and the number of consecutive cycles of the VCO clock signal that occurred within the counting period and is proportional to the difference between 32 MHz and the mean frequency of the VCO clock signal over the counting period.

The phase error accumulator 36 adds the count provided by the counter 32 in response to the positive going edge of the signal $REF_{200}$ to the previously accumulated value. The value stored in the phase error accumulator 36 represents phase error of the VCO clock signal. The maximum value that can be stored in the phase error accumulator 36 is limited to prevent overflow.

The value stored in the phase error accumulator 36 is applied to an adder 38, whereby the phase error is incremented by one-half, and the sum is accumulated into a phase accumulator 42, which again is updated in response to each positive going edge of the signal $REF_{200}$. The accumulated value is scaled by a divider 46 and the scaled value is applied to one input of a summation circuit 48. The output of the phase error accumulator 36 is also applied directly to a second input of the summation circuit 48, which provides a weighted sum of the outputs of the accumulators 36 and 42 as input to a digital-to-analog converter (DAC) 52. The DAC 52 is implemented using sigma delta modulation, which provides a digital value that is fed into an accumulator (not shown). The carry output of the accumulator is passed through a single pole low pass filter to provide an analog output signal, which is applied to a peak voltage control input of a ramp generator 56.

The spread spectrum control loop 24 comprises a counter 60 that counts positive going edges of the VCO clock signal. The first rising edge of the VCO clock signal following the positive going edge of the low frequency reference signal $REF_{200}$ captures the count stored in the counter 60 into a spread spectrum accumulator 64. The first rising edge of the VCO clock signal following the negative going edge of the signal $REF_{200}$ loads the value −78 into the counter 60. Each subsequent rising edge of the VCO clock signal increments the count stored in the counter by 1. Thus, the counting period of the counter is the second half of the period of the signal $REF_{200}$. If 79 VCO clock edges occur before the positive going edge of the signal $REF_{200}$, the counter 60 contains the count 0 at the end of its counting period. In general, the count stored in the counter 60 at the end of its counting period is equal to the difference between 79 and the number of consecutive cycles of the VCO clock signal that occurred within the counting period and is proportional to the difference between 31.6 MHz and the average frequency of the VCO clock signal during the counting period.

The accumulator 64 adds the count provided by the counter 60 in response to the positive going edge of the signal $REF_{200}$ to the previously accumulated value. The maximum value that can be stored in the accumulator 64 is limited to prevent overflow. The value stored in the accumulator is applied as input to a DAC 66. The DAC 66 is implemented in similar fashion to the DAC 52, and the analog output of the DAC 66 is applied to a slew rate control input of the ramp generator 56.

Figure 2:
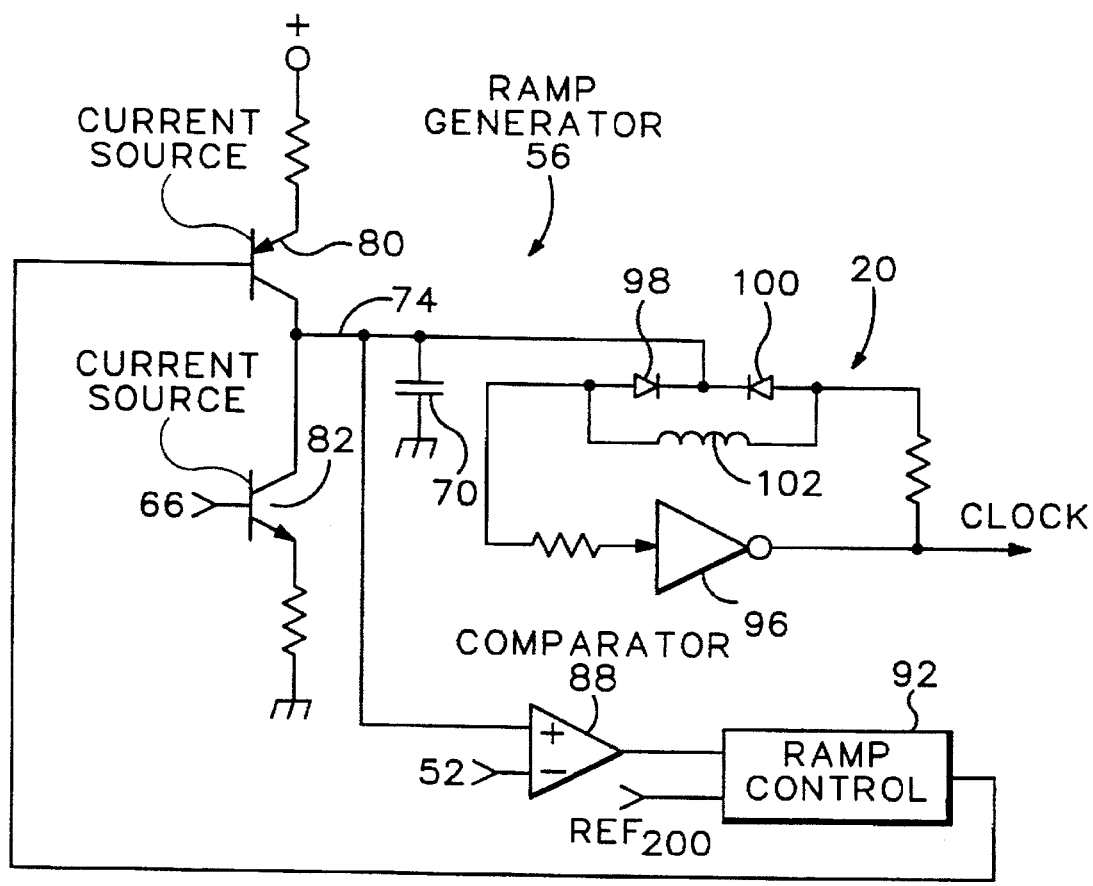
FIG. 2 is a partial schematic diagram illustrating part of the clock generator.

As shown in FIG. 2, the ramp generator comprises a capacitor 70 connected between a node 74 and ground, a charging current source transistor 80, and a discharging current source transistor 82. The node 74 is connected to the non-inverting input of a comparator 88. The output of the DAC 52 is connected to the inverting input of the comparator 88.

The charging current source transistor 80 is responsive to a ramp control circuit 92, whereas the discharging current source transistor 82 is responsive to the output of the DAC 66. The ramp control circuit causes the transistor 80 to turn on in response to a rising edge of the signal $REF_{200}$ or when the count in the counter 32 reaches −4, whichever occurs earlier, and to turn off when the voltage at the node 74 exceeds the output voltage of the DAC 52, as sensed by the comparator 88.

The VCO 20 comprises an inverter 96 and a feedback loop that includes two variable capacitance diodes 98 and 100 having their cathodes connected to the node 74 and their anodes connected to the input and output respectively of the inverter. An inductor 102 is connected in parallel with the diodes 98 and 100. The oscillation frequency of the VCO depends on the reactance of the parallel combination of the inducter 102 and the diodes 98, 100, which varies in accordance with the voltage to which the capacitor 70 is charged.

Figure 3:
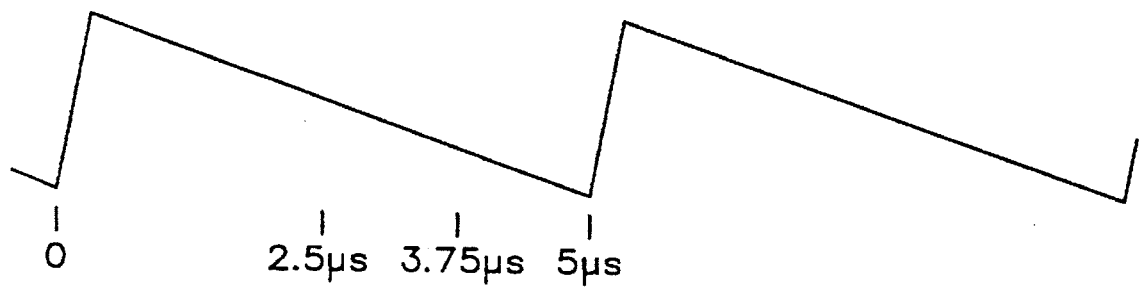
FIG. 3 is a graph illustrating operation of the clock generator.

In operation of the ramp generator, assuming that the voltage at the node 74 is less than the output voltage of the DAC 52 and the transistor 80 is off, the transistor 82 supplies current to discharge the capacitor 70 at a relatively slow rate, depending upon the output voltage of the DAC 66. Thus, the voltage at the node 74 declines fairly slowly, and the oscillation frequency of the VCO 20 similarly declines. The voltage at the node 74 continues to decline until a rising edge of the signal $REF_{200}$ occurs. The ramp control circuit 92 then turns on the transistor 80, which supplies a much larger current than the transistor 82 and rapidly charges the capacitor 70. The voltage at the node 74 increases rapidly, and when it reaches the output voltage of the DAC 52, the output of the comparator 88 changes state and the ramp control circuit turns the transistor 80 off, allowing the transistor 82 to discharge the capacitor 70 once more. The ramp generator 56 therefore generates a periodic voltage ramp signal at the node 74 and consequently the oscillation frequency of the VCO 20 varies in accordance with the asymmetrical sawtooth function shown in FIG. 3. In a practical implementation of the invention, the duration of the rising segment of the ramp signal is about 5 percent of the period of the ramp signal (8 VCO clocks). Since the magnitude of the slew rate over one segment of the ramp signal is much greater than the magnitude of the slew rate over the other segment of the ramp signal, the frequency of the VCO clock signal does not remain in any range for a substantial period of time. Consequently, the EMI emission due to the clock signal is at a much lower level than if the ramp were symmetrical.

The center frequency loop 22 controls the peak voltage at which the comparator 88 switches to end the charging of the capacitor 70, whereas the spread spectrum loop 24 controls the current supplied by the transistor 82 and therefore the slope of the falling segment of the ramp signal.

The center frequency control loop 22 forces an average phase error of zero. Because the phase-locked loop is digital, and therefore the measured phase error is always an integer number of clock periods, the instantaneous measured phase error will jitter between +0.5 VCO clocks and −0.5 VCO clocks. The scaling of the zero phase error contribution to the summation circuit 48 depends on the loop response: the frequency corresponding to the time taken for the loop to respond to an error in the VCO clock signal and force it back to its proper value. The loop response must be lower than the reference frequency (200 kHz) and is set at about 10 kHz. The actual phase error will jitter somewhat less than +/−0.5 clocks. The amount of the actual phase jitter is just enough for each 160th VCO clock edge to fall on either side of the rising edge of the signal REF$_{200}$ at the end of successive ramp periods. As the phase jitter decreases, the effective gain of quantizing the phase error to +/−0.5 clocks increases. Thus, a phase error of +0.05 clocks has the same effect on the output of the DAC 52 as a phase error of +0.45 clocks. At some point, this increase in gain makes the loop unstable and the jitter increases, reducing the effective gain. The jitter will thus remain at the amplitude resulting in an effective gain that is on the verge of instability. Adding the phase error to the phase accumulation using the summation circuit 48 provides lead compensation. Addition of the value 0.5 by the adder 38 ensures that the amount of time for which the phase error is positive is equal to the amount of time for which the phase error is negative.

The spread spectrum loop 24 forces the slew rate during the declining portion of the ramp to a value such that there will be 79 VCO clock pulses in the second half of each 5 μs period of the ramp signal. This corresponds to an average frequency over the second half of the ramp equal to 31.6 MHz. Since the center frequency loop forces the average frequency to 32 MHz, this implies that during the ramp period, the clock frequency varies from 32.8 MHz to 31.2 MHz if the rising edge of the signal REF$_{200}$ occurs 4 VCO clocks before the center of the rising segment of the ramp. If the rising edge of the signal REF$_{200}$ is not precisely 4 VCO clocks before the center of the rising segment of the ramp, the clock frequency range will be somewhat different from that indicated above.

Whereas the center frequency loop keeps every 160th VCO clock edge jittering across the rising edge of the reference signal REF$_{200}$, the spread spectrum loop causes the 81st clock edge of each 160 clock edges to jitter across the falling edge of the reference signal. If the spread is slightly small, so that there are 79.1 VCO clocks in the second half of a ramp period, and the center frequency loop phase error is more than 0.1 clocks, the spread spectrum loop will count 79 clocks and not adjust the spread. But the center frequency loop forces the actual phase error to jitter around zero, and before long there will be a ramp period where the center frequency phase error is less than 0.1 clocks. At this point, the spread spectrum loop will count 80 clocks instead of 79 and increase the spread slightly.

If a circuit perturbation causes a reduction in the center frequency of the VCO, the frequency measured by the spread spectrum loop decreases. The spread spectrum loop responds by reducing the spread, and reducing the spread with a given peak frequency increases the average frequency. This helps satisfy the center frequency loop, which requires that the center frequency be increased to compensate for the reduction. Thus, the action of the spread spectrum loop helps stabilize the center frequency loop rather than tending to destabilize it, as would be the case if the spread spectrum loop monitored the frequency during the first half of the negative slope portion of the ramp signal.

By controlling the average frequency and spread so that the maximum frequency is 32.8 MHz, a frequency margin of 0.5 MHz is provided between the maximum clock frequency and the rated clock frequency for the processor 10. This margin is sufficient to ensure that under normal circumstances the VCO clock frequency will never exceed the rated clock frequency of the processor, causing possible improper operation.

It will be appreciated that the invention is not restricted to the particular embodiment that has been described, and that variations may be made therein without departing from the scope of the invention as defined in the appended claims and equivalents thereof. For example, if the center frequency loop directly controlled the average frequency instead of the peak frequency, there would be no interaction between the center frequency loop and the spread spectrum loop, and the spread spectrum loop could then monitor the number of VCO clock edges in any segment of the ramp whose center was spaced from the center of the ramp, without there being any tendency for the action of one loop to destabilize the other loop. Also, if the difference between the number of clock edges counted by the spread spectrum counter during its portion of the ramp and the average number of clock edges that occur during an interval of that duration were greater, the effect of the correction provided by the spread spectrum loop would be greater, and there would be no need for the zero phase error branch of the center frequency loop. This could by accomplished by operating the VCO at a higher frequency and, if necessary, dividing the VCO output signal to provide the microprocessor clock signal, employing a lower frequency reference signal, so that the period of the ramp signal is longer, or increasing the frequency spread.

I claim:

1. A phase-locked loop circuit comprising:

a VCO having a control terminal and a signal output terminal, a voltage ramp generator having an output connected to the control terminal of the VCO and also having first and second ramp control inputs for receiving first and second control signals, and a reset input for receiving a periodic reset signal, whereby the voltage ramp generator generates a periodic voltage ramp signal at its output, the voltage ramp signal having a mean magnitude and a peak-to-peak amplitude that depend on said control signals, and the VCO generates an oscillatory output signal of a frequency that depends on voltage of said periodic voltage ramp signal, a first control loop connected between the signal output terminal of the VCO and the first ramp control input of the voltage ramp generator, said first control loop generating said first control signal responsive to a first parameter of the VCO output signal, and a second control loop connected between the signal output terminal of the VCO and the second ramp control input of the voltage ramp generator, said second control loop generating said second control signal dependent on a second parameter of the VCO output signal.

2. A circuit according to claim 1, wherein the peak-to-peak amplitude of the voltage ramp signal is defined between a positive peak voltage and a negative peak voltage and one of said peak voltages depends on said first control signal, and the first control loop comprises a means for measuring phase difference between the VCO output signal and a reference waveform of a predetermined nominal frequency, a means for offsetting the phase difference by a quantity less than one, and a means for integrating the offset phase difference.

3. A circuit according to claim 2, wherein the means for measuring phase difference between the VCO output signal and the reference waveform comprises a means for measuring difference between average frequency of the VCO output signal and said predetermined nominal frequency, and a means for integrating the frequency difference.

4. A circuit according to claim 1, wherein the peak-to-peak amplitude of the voltage ramp signal is defined between a positive peak voltage and a negative peak voltage and one of said peak voltages depends on said first control signal, and the voltage ramp signal has a slew rate that depends on said second control signal.

5. A circuit according to claim 4, wherein the first control loop comprises a means for adjusting the positive peak voltage to achieve a predetermined average frequency and the second control loop comprises a means for adjusting the slew rate to achieve a predetermined frequency spread.

6. A circuit according to claim 4, wherein said first and second ramp control inputs are a positive peak voltage control input and a slew rage control input and the first control loop is connected to the peak voltage control input and the second control loop is connected to the slew rate control input.

7. A circuit according to claim 6, wherein the first control loop comprises a means for monitoring average frequency of the VCO output signal and the second control loop comprises a means for monitoring frequency of the VCO output signal during a portion of the period of the ramp signal.

8. A circuit according to claim 1, wherein the ramp generator comprises a means for controlling the periodic voltage ramp signal so that each period is composed of a first segment, during which the ramp signal has a first slew rate, and a second segment, during which the ramp signal has a second slew rate, the first and second slew rates being of opposite polarity and the magnitude of the first slew rate being much greater than the magnitude of the second slew rate.

9. A spread spectrum clock generator, comprising:

a VCO having a control terminal and an output terminal, and a ramp generator for generating a periodic voltage ramp signal and applying the periodic voltage ramp signal to the control terminal of the VCO, periodic voltage ramp signal having a rising segment and A falling segment and the magnitude of slope of one of the segments being much greater than magnitude of the slope of the other segment.

10. A spread spectrum clock generator, comprising:

a VCO having a control terminal and an output terminal, and a ramp generator for generating a periodic voltage ramp signal and applying the periodic voltage ramp signal to the control terminal of the VCO, the periodic voltage ramp signal having a rising segment and a falling segment and magnitude of slope of one of the segments being much greater than magnitude of slope of the other segment, and wherein the ramp generator comprises a capacitor, a first current source for charging the capacitor at a first rate, a second current source for discharging the capacitor at a second rate, responsive to a slew rate control signal, and a ramp control means for selectively turning one of the current sources on and off.

11. A clock generator according to claim 10, wherein the ramp control means comprises a means for turning the first current source on in response to a periodic reference signal and turning the first current source off when ramp magnitude reaches a level that depends on a first operating condition of the VCO, and a means for controlling the second current source to supply a constant current at a level that depends on a second operating condition of the VCO.

12. Electronic apparatus comprising:

a timed device that is responsive to input signals to change state on occurrence of a clocking transition at a clock input of the timed device, and a clock generator that generates a clock signal having a succession of clocking transitions at a clock output connected to the clock input of the timed device, and wherein frequency of the clock signal varies periodically in accordance with a ramp function, each period of the ramp function being composed of a first segment, during which the period of the clock signal changes at a first rate, and a second segment, during which the period of the clock signal changes at a second rate, the first and second rates being of opposite polarity and magnitude of the first rate being much greater than magnitude of the second rate.

13. Apparatus according to claim 12, wherein the clock generator comprises a phase-locked loop circuit that synchronizes the ramp function to a periodic reference signal.

14. A method of operating electronic apparatus that comprises a timed device responsive to input signals to change state on occurrence of a clocking transition at a clock input of the timed device, said method comprising applying a periodic clock signal having a succession of clocking transitions to the clock-input of the timed device, and varying the period of clock signal periodically in accordance with a ramp function, each period of the ramp function being composed of a first segment, during which the period of the clock signal changes at a first rate, and a second segment, during which the period of the clock signal changes at a second rate, the first and second rates being of opposite polarity and magnitude of the first rate being much greater than magnitude of the second rate.

15. Electronic apparatus comprising:

a timed device that is responsive to input signals to change state on occurrence of a clocking transition at a clock input of the timed device, and a clock generator that generates a clock sisal having a succession of clocking transitions at a dock output connected to the clock input of the timed device, and wherein frequency of the clock signal varies periodically in accordance with a ramp function, each period of the ramp function being composed of a first segment, during which period of the clock signal changes at a first rate, and a second segment, during which period of the clock signal changes at a second rate, the first and second rates being of opposite polarity and magnitude of the first rate being much greater than magnitude of the second rate, and wherein the clock generator comprises:

a VCO having a control terminal and a signal output terminal, said signal output terminal being connected to the clock output of the of the clock generator, a voltage ramp generator having an output connected to the control terminal of the VCO and also having first and second ramp control inputs for receiving first and second control signals, and a reset input for receiving a periodic reset signal, whereby the voltage ramp generator generates a periodic voltage ramp signal at its output, the voltage ramp signal having a mean magnitude and a peak-to-peak amplitude that depend on said control signals, and the VCO generates said clock signal at a frequency that depends on voltage of said periodic voltage ramp signal, a first control loop connected between the signal output terminal of the VCO and the first ramp control input of the voltage ramp generator, said first control loop generating said first control signal responsive to a first parameter of the VCO output signal, and a second control loop connected between the signal output terminal of the VCO and the second ramp control input of the voltage ramp generator, said second control loop generating said second control signal dependent on a second parameter of the VCO output signal.

16. Apparatus according to claim 15, wherein the first and second control loops include respective counters for counting transitions of the VCO output signal and generating the first and second ramp control signals in digital form.

17. Apparatus according to claim 16, wherein the counter in the first control loop counts transitions of the VCO output signal during a period of the periodic reset signal.

18. Apparatus according to claim 16, wherein the counter in the second control loop counts transitions of the VCO output signal during an interval that is within the second segment of the period of the ramp function and of which center is offset in time from center of the second segment of the period of the ramp function.

19. A circuit according to claim 1, wherein the voltage ramp generator comprises a capacitor, a first current source for charging the capacitor at a first rate, and a second current source for discharging the capacitor at a second rate, and wherein at least one of said current sources is responsive to a slew rate control signal.

20. A circuit according to claim 1, wherein the voltage ramp generator comprises a capacitor, a first current source for charging the capacitor at a first rate, and a second current source for discharging the capacitor at a second rate, and wherein one of said current sources is responsive to a slew rate control signal and the circuit further comprises a ramp control means for selectively turning the other current source on and off.

21. A circuit according to claim 20, wherein said ramp control means comprises a means for turning the first current source on in response to a periodic reference signal and turning the first current source off when ramp magnitude reaches a level that depends on a first operating condition of the VCO, and a means for controlling the second current source to supply a constant current at a level that depends on a second operating condition of the VCO.

22. A circuit according to claim 1, wherein the first ramp control input of the voltage ramp generator is a slew rate input and the second ramp control input thereof is a peak magnitude input, and the voltage ramp generator generates a periodic voltage ramp signal such that each period is composed of a first segment, during which the ramp signal has a first slew rate that depends on the first ramp control input and attains a voltage level that depends on the second ramp control input, and a second segment, during which the ramp signal has a second slew rate, the first and second slew rates being of opposite polarity.

23. A circuit according to claim 1, wherein said first and second parameters of the VCO output signal each depend on phase of the VCO output signal.

24. A circuit according to claim 1, wherein said first parameter depends on phase of the VCO output signal at a predetermined point in the period of the periodic reset signal.

25. A circuit according to claim 1, wherein said second parameter depends on phase of the VCO output signal at a first point in the period of the periodic reset signal and phase of the VCO output signal at a second point in the the period of the periodic reset signal.

26. A circuit according to claim 1, wherein the first and second control loops include respective counters for counting transitions of the VCO output signal and generating the first and second ramp control signals in digital form.

27. A circuit according to claim 26, wherein the counter in the first control loop counts transitions of the VCO output signal during a period of the periodic reset signal.

28. A circuit according to claim 26, wherein the counter in the second control loop counts transitions of the VCO output signal during an interval that is within the second segment of the period of the ramp function and of which center is offset in time from center of the second segment of the period of the ramp function.

* * * * *

UNITED STATES PATENT AND TRADEMARK OFFICE
CERTIFICATE OF CORRECTION

PATENT NO. : 5,659,587
DATED : August 19, 1997
INVENTOR(S) : David L. Knierim

It is certified that error appears in the above-identified patent and that said Letters Patent is hereby corrected as shown below:

Column 7, line 42, after "slew" and before "control," delete "rage" and insert --rate--;

Column 7, line 66, after "and" and before "falling," delete "A" and insert --a--;

Column 8, line 23, after "ramp" and before "and" delete "magnitude" and insert --amplitude--;

Column 8, line 65, after "clock" and before "having," delete "sisal" and insert --signal--;

Column 8, line 66, after "a" and before "output," delete "dock" and insert - -clock- -;

Column 9, line 22, after "said" and before "signal," delete "dock" and insert - -clock- -;

Column 10, line 38, after "the" and before "period", delete "the".

Signed and Sealed this

Twentieth Day of January, 1998

Attest:

BRUCE LEHMAN

Attesting Officer

Commissioner of Patents and Trademarks